United States Patent
Bedell et al.

(10) Patent No.: US 10,460,937 B2
(45) Date of Patent: Oct. 29, 2019

(54) POST GROWTH HETEROEPITAXIAL LAYER SEPARATION FOR DEFECT REDUCTION IN HETEROEPITAXIAL FILMS

(71) Applicant: INTERNATIONAL BUSINESS MACHINES CORPORATION, Armonk, NY (US)

(72) Inventors: Stephen W. Bedell, Wappingers Falls, NY (US); Cheng-Wei Cheng, White Plains, NY (US); Kunal Mukherjee, Goleta, CA (US); John A. Ott, Greenwood Lake, NY (US); Devendra K. Sadana, Pleasantville, NY (US); Brent A. Wacaser, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 15/805,801

(22) Filed: Nov. 7, 2017

(65) Prior Publication Data

US 2018/0277368 A1 Sep. 27, 2018

Related U.S. Application Data

(63) Continuation of application No. 15/467,265, filed on Mar. 23, 2017.

(51) Int. Cl.
| | | |
|---|---|---|
| *H01L 21/02* | (2006.01) | |
| *H01L 21/3065* | (2006.01) | |
| *H01L 21/306* | (2006.01) | |
| *H01L 29/04* | (2006.01) | |

(52) U.S. Cl.
CPC .. *H01L 21/02694* (2013.01); *H01L 21/02488* (2013.01); *H01L 21/02538* (2013.01); *H01L 21/02546* (2013.01); *H01L 21/02609* (2013.01); *H01L 21/02614* (2013.01); *H01L 21/02664* (2013.01); *H01L 21/02667* (2013.01); *H01L 21/3065* (2013.01); *H01L 21/30617* (2013.01);

(Continued)

(58) Field of Classification Search
None
See application file for complete search history.

(56) References Cited

U.S. PATENT DOCUMENTS

6,372,356 B1 * 4/2002 Thornton ................ B32B 15/01
257/189
9,553,153 B1 * 1/2017 Ott ...................... H01L 21/0254
(Continued)

*Primary Examiner* — Benjamin P Sandvik
(74) *Attorney, Agent, or Firm* — Tutunjian & Bitetto, P.C.; Erik Johnson (57) ABSTRACT

A method for reducing crystalline defects in a semiconductor structure is presented. The method includes epitaxially growing a first crystalline material over a crystalline substrate, epitaxially growing a second crystalline material over the first crystalline material, and patterning and removing portions of the second crystalline material to form openings. The method further includes converting the first crystalline material into a non-crystalline material, depositing a thermally stable material in the openings, depositing a capping layer over the second crystalline material and the thermally stable material to form a substantially enclosed semiconductor structure, and annealing the substantially enclosed semiconductor structure.

10 Claims, 5 Drawing Sheets

(52) U.S. Cl.
CPC ........ *H01L 29/04* (2013.01); *H01L 21/02513* (2013.01)

(56) References Cited

U.S. PATENT DOCUMENTS

| | | | | |
|---|---|---|---|---|
| 2012/0094467 A1* | 4/2012 | Wu | H01L 21/02381 | 438/429 |
| 2012/0273840 A1* | 11/2012 | Luo | H01L 21/02639 | 257/200 |
| 2014/0131724 A1* | 5/2014 | Bayram | H01L 29/04 | 257/76 |
| 2014/0220751 A1* | 8/2014 | Lee | H01L 29/66795 | 438/283 |
| 2015/0024223 A1* | 1/2015 | Wang | H01L 21/02466 | 428/457 |
| 2016/0126335 A1* | 5/2016 | Fogel | H01L 21/02587 | 438/429 |
| 2016/0268123 A1* | 9/2016 | de Souza | H01L 29/16 | |

* cited by examiner

POST GROWTH HETEROEPITAXIAL LAYER SEPARATION FOR DEFECT REDUCTION IN HETEROEPITAXIAL FILMS

BACKGROUND

Technical Field

The present invention relates generally to semiconductor devices, and more specifically, to a method for reducing defects within III-V semiconductor materials epitaxially grown on mismatched crystalline substrates.

Description of the Related Art

For many III-V semiconductor material epitaxies, for example gallium arsenide (GaAs), annealing at temperatures higher than the growth temperature (e.g., temperatures above about 550° C.) can be performed after epitaxial growth to reduce defects and reduce overall defect densities. However, high temperature annealing can cause issues when one of the III-V materials used to form the epitaxial layer exhibits a high partial vapor pressure. For example, during high temperature annealing, Group V materials, which tend to have higher vapor pressures than Group III materials, can evaporate from the surface of the III-V semiconductor epitaxy, thus leaving droplets of Group III material behind. Such decomposition of the III-V semiconductor can lead to pitting of the III-V semiconductor, and subsequently, erosion of layers formed on top of the III-V semiconductor. These defects can potentially degrade the performance of the III-V semiconductor device.

SUMMARY

In accordance with an embodiment, a method for reducing defects in a semiconductor structure. The method includes epitaxially growing a first crystalline material over a substrate, epitaxially growing a second crystalline material over the first crystalline material, and patterning and removing portions of the second crystalline material to form openings. The method further includes converting the first crystalline material into a non-crystalline material, depositing a thermally stable material in the openings, depositing a capping layer over the second crystalline material and the thermally stable material to form a crystalline structure substantially enclosed by non-crystalline material, and annealing the substantially enclosed crystalline structure.

In accordance with another embodiment, a semiconductor device for reducing crystalline defects is provided. The semiconductor device includes a first crystalline material epitaxially grown over a substrate, a second crystalline material epitaxially grown over the first crystalline material, where openings are formed within the second crystalline material, a thermally stable material deposited in the openings after converting the first crystalline material into a non-crystalline material, a capping layer deposited over the second crystalline material and the thermally stable material to form a substantially enclosed crystalline structure that is epitaxially aligned to the crystal structure of the substrate. The substantially enclosed semiconductor structure can be annealed.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The following description will provide details of preferred embodiments with reference to the following figures wherein.

Throughout the drawings, same or similar reference numerals represent the same or similar elements.

DETAILED DESCRIPTION

Embodiments of the present invention relate to reducing crystalline defects in semiconductor devices. For many semiconductor devices (e.g., complementary metal oxide semiconductor (CMOS) transistors, optoelectronics with on chip lasers and amplifiers, etc.) it is desirable to have small regions of different semiconductor materials with a controlled crystallographic orientation and high crystal quality grown on a substrate, such as, e.g., silicon (Si). This is desirable because Si is the most well developed substrate and can be produced in high quality and cleanliness in large size wafers (e.g., up to about 450 mm diameter wafers). Other materials that have desirable material-based properties that compliment those of Si are, for example, III-V materials that are often direct band gap materials and lead to efficient optical devices. Also some III-V materials have higher mobilities than Si. Thus, combining small areas of III-V and other hetero materials on a Si substrate can take advantage of the beneficial properties of each.

However, III-V semiconductor materials epitaxially grown on mismatched crystalline substrates can have crystalline defects, which can affect the performance of the semiconductor device. One approach to reduce the defects is to anneal the semiconductor material at a temperature above the epitaxial growth temperature. Annealing at these temperatures reduces a portion of the crystalline defects and further reduces the overall defect density. The evaporation of the Group V material can be mitigated by providing an ambient of Group V material vapor within the annealing chamber during the annealing process. However, as the temperature increases during the annealing process, so does the partial pressure of the Group V material above the III-V semiconductor. This can result in a practical upper annealing temperature limit even with ambient Group V material partial pressures supplied.

Embodiments of the present invention provide for a crystalline material to be epitaxially grown between the substrate and the III-V semiconductor. After patterning and removing portions of the III-V semiconductor, the crystalline material is converted to a non-crystalline material by, e.g., oxidation to effectively separate the substrate from the remaining III-V semiconductor. However, the overall crystal orientation of the substrate and the remaining III-V semiconductor remain epitaxially related. A thermally stable non-crystalline material can then be deposited, as well as a capping layer. The structure is then annealed to reduce the defects within the remaining III-V semiconductor. Thus, a high-quality, low-defect crystalline semiconductor structure is created by converting a non-crystalline material between the substrate and the remaining III-V semiconductor into a crystalline material before annealing the structure.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

As used herein, an "anisotropic etch process" denotes a material removal process in which the etch rate in the direction normal to the surface to be etched is greater than in the direction parallel to the surface to be etched. The anisotropic etch can include reactive-ion etching (RIE).

Reactive ion etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation.

The term "processing" as used herein includes deposition of material or photoresist, patterning, exposure, development, etching, cleaning, stripping, implanting, doping, stressing, layering, and/or removal of the material or photoresist as required in forming a described structure.

As used herein, the term "III-V semiconductor" denotes a semiconductor material that includes at least one element from Group III of the Periodic Table of Elements (B, Al, Ga, In) and at least one element from Group V of the Periodic Table of Elements (N, P, As, Sb, Bi). The III-V semiconductors can be binary alloys, ternary alloys, or quaternary alloys, of III-V elements. Examples of III-V semiconductors that can be used in the present invention include, but are not limited to GaAs, InAs, InP, InGaAs, InAlAs, InAlAsP, AlInGaP, InGaAsP, GaN, InAlN, AlSb, InAlAsSb, and alloys thereof. As used herein, "epitaxy" refers to the deposition of a crystalline overlayer on a crystalline substrate, while "heteroepitaxy" refers specifically to epitaxy performed with materials that are different from each other. Heteroepitaxy implies that although the materials and crystal structures may not be identical, the crystal structures are related, with the substrate or underlying layer templating the crystal structure of the overlayer.

As used herein, the term "about" modifying the quantity of an ingredient, component, or reactant of the invention employed refers to variation in the numerical quantity that can occur, for example, through measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1:
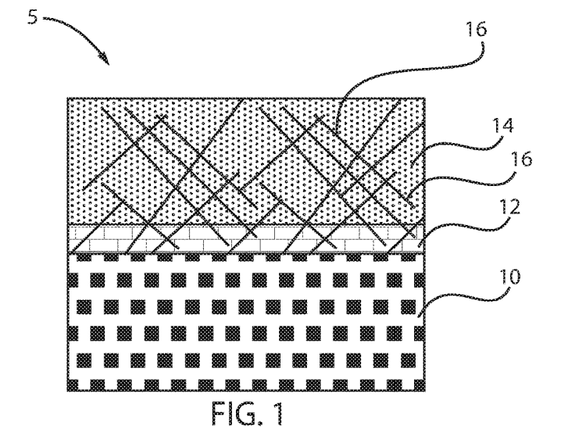
FIG. 1 is a cross-sectional view of an epitaxially grown III-V semiconductor on a crystalline material, which in turn is grown on a substrate, in accordance with an embodiment of the present invention.

FIG. 1 is a cross-sectional view of an epitaxially grown III-V semiconductor on a crystalline material, which in turn is grown on a substrate, in accordance with an embodiment of the present invention.

In various embodiments, a structure 5 includes an epitaxially grown III-V semiconductor 14 formed over crystalline material 12, which in turn is formed over a substrate 10. A plurality of defects 16 are shown in the III-V semiconductor 14. The III-V semiconductor 14 is separated from the substrate 10 by the crystalline material 12. This allows for the separation of the crystal structures of the III-V semiconductor 14 and the substrate 10.

The III-V semiconductor 14 can be blanket grown and can have a thickness of about 1 nanometers (nm) to about 5 micrometers (μm). As used herein the term "blanket grown" can be defined as describing being grown in a large area, namely an area greater than or equal to about 1 square micrometer, or, greater than or equal to about 1.5 square micrometers, or, greater than or equal to about 2 square micrometers.

Methods for epitaxial growth include metal organic chemical vapor deposition (MOCVD), metal organic vapor phase epitaxy (MOVPE), plasma enhanced CVD (PECVD), remote plasma enhanced CVD (RP-CVD), molecular beam epitaxy (MBE), hydride vapor phase epitaxy (HVPE), chloride vapor phase epitaxy (Cl-VPE), liquid phase epitaxy (LPE), and epitaxial lateral overgrowth (ELOG).

The III-V semiconductor 14 can include III-V semiconductor materials including, but not limited to, GaAs, InAs, InP, InGaAs, InAlAs, InAlAsP, AlInGaP, InGaAsP, GaN, InAlN, AlSb, InAlAsSb, and alloys thereof. In some embodiments, the III-V semiconductor 14 can be a binary material, for e.g., GaAs. The III-V semiconductor 14 can be doped, undoped or contain doped and undoped regions therein, and can have a single crystal orientation, or can have surface regions that have different crystal orientations. The III-V semiconductor 14 can be strained, unstrained or a combination thereof. In some embodiments, a graded III-V semiconductor 14 can be formed.

In some embodiments, the epitaxially grown III-V semiconductor 14 includes defects 16 in the crystalline lattice. In some embodiments, the III-V semiconductor 14 can include III-V material that crystallizes at a certain temperature, for example, of about 300 to about 1100° C., forming a single or multi crystalline structure, as compared to the more amorphous structure. The defects 16 formed within the III-V semiconductor 14 can be spread throughout the epitaxy, including the upper regions.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate, including high-k oxides and/or nitrides. In one or more embodiments, the substrate 10 can be a silicon wafer. In an embodiment, the substrate 10 is a single crystal silicon wafer. In another embodiment, the substrate 10 is a crystalline substrate material, such as Si.

Figure 2:
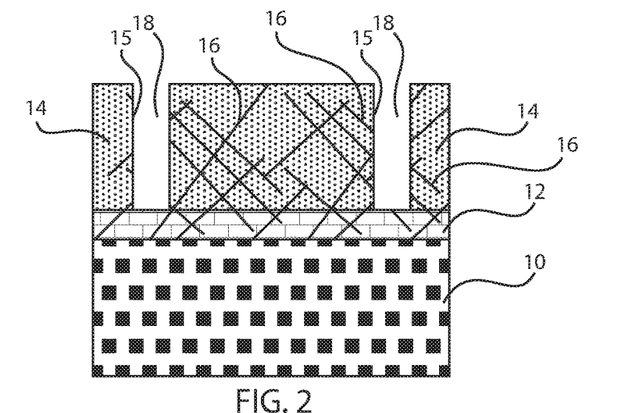
FIG. 2 is a cross-sectional view of FIG. 1 where a portion of the epitaxially grown III-V semiconductor is removed, in accordance with an embodiment of the present invention.

FIG. 2 is a cross-sectional view of FIG. 1 where a portion of the epitaxially grown III-V semiconductor is removed, in accordance with an embodiment of the present invention.

In various embodiments, the III-V semiconductor 14 is patterned and unwanted material is removed. The removal of portions of the III-V semiconductor 14 results in openings 18 being formed, the openings defining inner surfaces or vertical sidewalls 15.

A photoresist material (not shown) can be formed over an upper surface of the III-V semiconductor 14. The photoresist material can then be patterned by a photolithography process to provide a photoresist pattern. After the photoresist material is patterned, a portion of the III-V semiconductor 14 can be removed by using, e.g., a conventional etching process to form the openings 18. Alternatively the pattern can be formed by other conventional means like stencil lithography using a shadow mask or nanoimprint lithography.

The etching process can be performed in one or more steps. The etching process can include a wet etching with reactive chemicals or dry etching process such as reactive ion etching (RIE), ion beam etching, or plasma etching. The patterned photoresist or other material can be removed or remain after the openings 18 are formed. The openings 18 can expose an upper surface of the crystalline material 12. The openings 18 can be defined by vertical sidewalls 15 of the III-V semiconductor 14. In one example, employing slated walls can alter the expansion/contraction forces during annealing and can improve the reduction in defects. In some embodiments, the opening 18 can have a width of about 5 nanometers (nm) to about 1000 nm or more if applicable to the technology.

Figure 3:
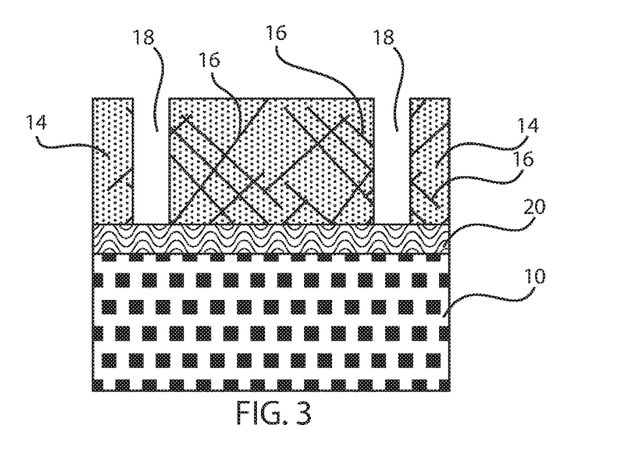
FIG. 3 is a cross-sectional view of FIG. 2 where the crystalline material formed over the substrate is converted to a non-crystalline material, in accordance with an embodiment of the present invention.

FIG. 3 is a cross-sectional view of FIG. 2 where the crystalline material formed over the substrate is converted to a non-crystalline material, in accordance with an embodiment of the present invention.

In various embodiments, the crystalline material 12 is converted to a non-crystalline material 20, e.g., by oxidation, to effectively separate the crystal structure of the III-V semiconductor 14 from that of the substrate 10. However, the overall crystal orientation of the substrate 10 and the III-V semiconductor 14 remain epitaxially related. The crystalline material 14 can be heteroepitaxially grown on the substrate 10. After full growth, the crystalline material 14 can be converted to a non-crystalline material 20.

Figure 5:
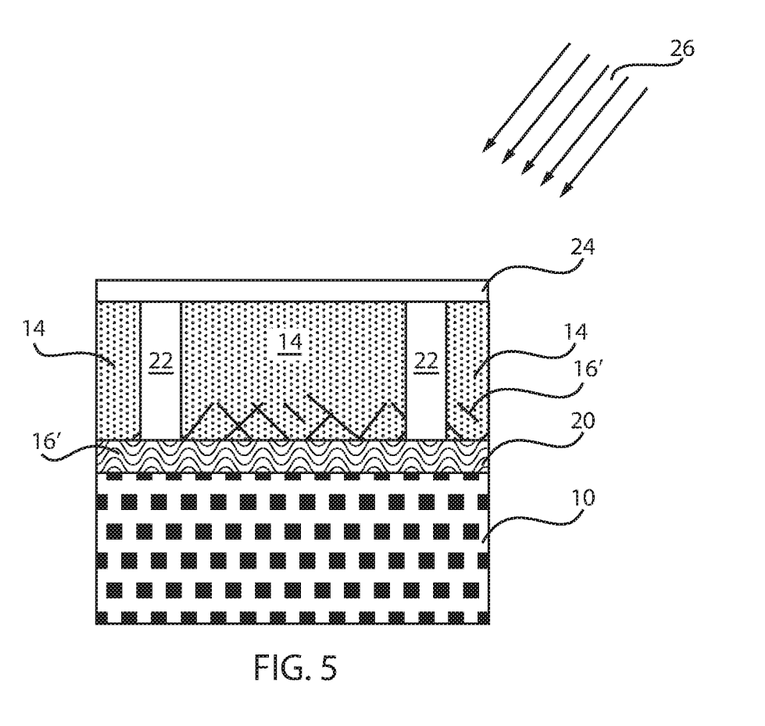
FIG. 5 is a cross-sectional view of FIG. 4 where annealing takes place so that defects within the epitaxially grown III-V semiconductor are reduced, in accordance with an embodiment of the present invention.

The III-V semiconductor 14 is separated from the substrate 10 by the non-crystalline material 20. This further allows for the separation of the crystal structures of the III-V semiconductor 14 and the substrate 10. This also allows for more freedom at the surface interfaces and more movement, as well as a reduction in defects during subsequent annealing 26 (FIG. 5).

If the crystalline material 14 were still in contact with the crystalline material 12, any misfit, strain or difference to the crystalline structure would still exists during anneal and when cooled. Thus, the mechanisms that led to the creation of the defects would still be present. In contrast, in the exemplary embodiments of the present invention, the intervening crystalline layer 12 is converted to a non-crystalline layer 20. The intervening non-crystalline layer 20 is now no longer constrained to a constant crystalline lattice and can thus more easily conform at the interface to the crystalline structure of layer 14 to allow the crystalline defects to relax by removing the forces and mechanisms causing the defects to be present.

Additionally, when the non-crystalline layer 20 is an insulator like an oxide, it also serves a secondary purpose. The non-crystalline layer 20 not only disconnects the two layers 10, 14 physically for crystallographic reasons, but also isolates such layers 10, 14 electrically so that such layers 10, 14 are no longer electrically connected. This has many advantages and can be useful when using a material like silicon-on-insulator (SOI), germanium-on-insulator (GOI), etc.

There are at least two embodiments for converting the crystalline material 12 into a non-crystalline material 20. First, by using a high aluminum (Al) content group III-V semiconductor for the crystalline material 12 (AlAs, AlP, InAlP, GaAlAs etc.), these materials oxidize at much lower temperatures and higher rates than other semiconductor crystalline materials. Thus, if the crystalline material 12 is one of these materials, after patterning and removal, the Al-III-V material can be oxidized, thus leaving a non-crystalline Al-III-Oxide material. Second, for Si materials, the crystalline material 12 could be a material that can easily be made into porous Si, for example, if a heavily p-type dopant, like Boron (B) is used. Si material can be grown on top of a lightly or n-type doped Si and then the layer can be made porous and then oxidized, thus creating a non-crystalline material 20.

Figure 4:
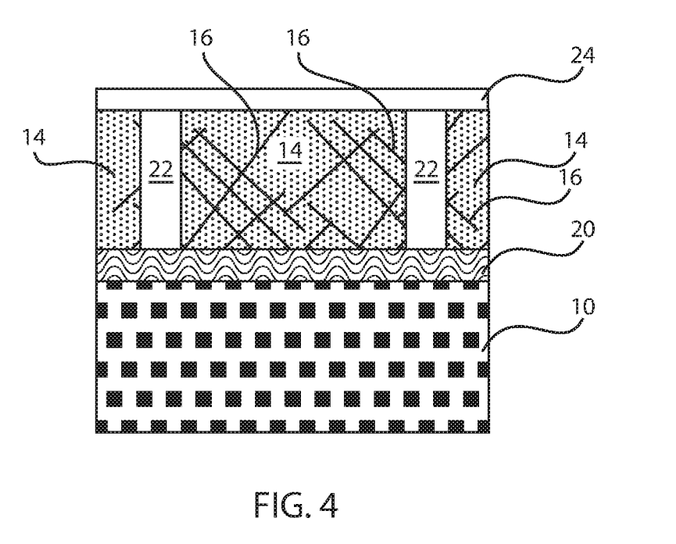
FIG. 4 is a cross-sectional view of FIG. 3 where a thermally stable non-crystalline layer is deposited and capped with a capping layer, in accordance with an embodiment of the present invention.

FIG. 4 is a cross-sectional view of FIG. 3 where a thermally stable non-crystalline layer is deposited and capped with a capping layer, in accordance with an embodiment of the present invention.

In various embodiments, a thermally stable material 22 is formed in the openings 18 and adjacent to the remaining III-V semiconductor 14. A capping layer 24 can then be deposited over the thermally stable material 22. The capping layer 24 can reduce decomposition/evaporation of volatile materials. The capping layer 24 can increase strain during thermal annealing (e.g., the capping layer 24 has a different coefficient of thermal expansion than the crystalline materials of 10 and 14, thus causing strain and stress to occur in the structure upon heating). The capping layer 24 can also allow the strain and stress to force movement of the defects (FIGS. 10-13).

The thermally stable material 22 can be formed using a conventional deposition technique, such as, for example, molecular beam epitaxy (MBE), chemical vapor deposition (CVD), plasma enhanced CVD (PECVD), atomic layer deposition (ALD), evaporation, physical vapor deposition (PVD), chemical solution deposition, and other like deposition processes. The thermally stable material 22 can include a low-k dielectric material including, but not limited to, an oxide and/or silicates. A "low-k" material is a dielectric material with a lower dielectric constant relative to silicon dioxide ($SiO_2$), which is 3.9 (e.g., the ratio of the permittivity of $SiO_2$ divided by the permittivity of a vacuum). The thermally stable material 22 can be porous or non-porous.

In some embodiments, the thermally stable material 22 includes an interlevel or intralevel dielectric material, including inorganic dielectrics and organic dielectrics. In some embodiments, the thermally stable material 22 is chosen to have a mismatched coefficient of thermal expansion (CTE) with the III-V semiconductor material. In some embodiments, the absolute value of the difference between the CTE of the III-V semiconductor 14 and the CTE of the thermally stable material 22 (the ACTE) can be about 1 to about 6, or about 2 to about 5. In a particular embodiment, the ACTE is about 4.1 or about 2.4. In general, the ACTE should be as large as possible to encourage stress and strain during annealing. In some embodiments, the thermally stable material 22 can be composed of silicon oxide.

The capping layer 24 covers the thermally stable material 22. In some embodiments, the thermally stable material 22 and the capping layer 24 can be of the same material and can be formed in a continuous manner. As discussed above with regard to the thermally stable material 22, in some embodiments, the capping layer 24 and the III-V semiconductor 14 can also have a ACTE of about 1 to about 6 or about 2 to about 5. In a particular embodiment, the ACTE can be about 4.1 or about 2.4.

In general, the ACTE should be as large as possible to encourage stress and strain during annealing. The capping layer 24 and the thermally stable material 22 can be chosen to engineer the expansion of these materials during annealing and manipulate the defect density and geographical distribution of defects after annealing. The capping layer 24 can be formed from a thermally stable material and can act as a passivating layer for the III-V semiconductor 14. In some embodiments, the capping layer 24 can include a material that is substantially similar to the material of the thermally stable material 22. In some embodiments, the capping layer 24 can be formed from silicon nitride, aluminum oxide, silicon oxide, or other similar materials. The capping layer 24 can also include carbon, hydrogen, or nitrogen atoms.

The capping layer 24 can be formed by utilizing any conventional deposition process including, but not limited to, plasma enhanced chemical vapor deposition (PECVD), microwave enhanced chemical vapor deposition (MECVD), chemical vapor deposition (CVD), atomic layer deposition (ALD), e-beam evaporation, and sputtering.

In some embodiments, the capping layer 24 can be formed using a process gas that includes silicon-containing gas, such as for example, silane ($SiH_4$), disilane, dichlorosilane, trichlorosilane, and tetraethylorthosilane, methylsilane ($CH_3SiH_3$), dimethylsilane ($(CH_3)_2SiH_2$), trimethylsilane ($(CH_3)_3SiH$), diethylsilane ($(C_2H_5)_2SiH_2$), propylsilane ($C_3H_8SiH_3$), vinyl methylsilane ($CH_2$=$CH)CH_3SiH_2$), 1,1,2,2-tetramethyl disilane ($HSi(CH_3)_2$—$Si(CH_3)_2H$), hexamethyl disilane ($(CH_3)_3Si$—$Si(CH_3)_3$), 1,1,2,2,3,3-hexamethyl trisilane ($H(CH_3)_2Si$—$Si(CH_3)_2$—$SiH(CH_3)_2$), and 1,1,2,3,3-pentamethyl trisilane ($H(CH_3)_2Si$—$SiH(CH_3)$—$SiH(CH_3)_2$). The process gas can also include an oxygen-containing gas, such as oxygen ($O_2$), nitrous oxide ($N_2O$), ozone ($O_3$), and carbon dioxide ($CO_2$). In a particular embodiment, the thermally stable material 22 and the capping layer 24 can be deposited by a more or less conformal coating of the surfaces by plasma enhanced CVD with non-stoichiometric silicon oxide ($SiO_x$).

The thickness of the capping layer 24 can vary depending on the deposition technique employed. In some embodiments, the capping layer 24 can have a thickness $T_{401}$ of about 1 nm to about 500 nm. The capping layer 24 covering the upper surface of the III-V semiconductor 14 can be effective as a capping/passivating layer that, along with the thermally stable material 22, protects the III-V semiconductor 14 during a high temperature anneal.

In some embodiments, layers 22 and 24 can be formed of the same material and be deposited at the same time with, e.g., a conformal deposition process being employed to fill the voids between 14 and to also provide the capping layer 24.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

FIG. 5 is a cross-sectional view of FIG. 4 where annealing takes place so that defects within the epitaxially grown III-V semiconductor are reduced, in accordance with an embodiment of the present invention.

In various embodiments, the structure of FIG. 4 is subjected to an annealing processes 26, such as, for example, rapid thermal annealing (RTA), flash lamp annealing, furnace annealing, laser annealing, and combinations including one or more of the foregoing. In some embodiments, the annealing process 26 can include multiple steps. The annealing processes 26 results in defects 16' (reduction of defects).

During the annealing process 26, the structure of FIG. 4 is heated to a temperature of about 500° C. to about 2000° C., or a temperature of about 600° C. to about 850°. In some embodiments, the annealing process can be carried out for a time period of about 1 second to about 600 seconds. The capping layer 24 and the thermally stable material 22 can prevent or limit the evaporation of the Group V material from the III-V semiconductor 14 during the annealing process 26. This can reduce the number of defects 16' in the III-V semiconductor 14 by allowing the high temperature anneal to mobilize and annihilate the defects 16' without the evaporation of Group V material.

In some embodiments, the structure of FIG. 4 can be annealed by subjecting it to multiple heating and cooling cycles. The heating and cooling cycles can heat to the same elevated temperature or the elevated temperature can be varied by cycle. Similarly, the cooling target temperature can be the same or varied by cycle. An exemplary annealing process includes heating from room temperature to about 750° C., then cooling to about 400° C., and repeating the heating (to about 700° C.) and cooling (to about 400° C.) cycle for the desired number of cycles. The number of cycles can be, e.g., 3 to 7, or, e.g., 4 to 6. After completion of the cycling the structure is cooled to room temperature.

The annealing process 26 can be performed in a controlled atmosphere of gaseous Group V material corresponding to the Group V material that is present in the III-V semiconductor 14. The combination of the capping layer 24, the thermally stable material 22, and the Group V material in the atmosphere may not only prevent the Group V material from evaporating out of the III-V semiconductor 14, but may even result in the atmospheric Group V material diffusing into the III-V semiconductor 14. This can reduce the number, as well as the magnitude of defects 16 in the III-V semiconductor 14.

In an exemplary embodiment, where the III-V semiconductor 14 is GaAs, an arsenic or arsine atmosphere (with a partial pressure of about $10^{-3}$ torr) can be maintained. Without the capping layer 24, the highest temperature that could be used for in situ annealing under the same arsenic atmosphere (about $10^{-3}$ torr), is about 700° C. This practical limit is approximately 50° C. above the congruent temperature for GaAs sublimation (e.g., the temperature at which the vapor pressures of the gallium and arsenic are equal). However, because the capping layer 24 and the thermally stable material 22 can prevent or limit evaporation and migration of the As out of the III-V semiconductor 14, the annealing temperature can be raised well above 700° C. without causing surface faceting or decomposition of the III-V semiconductor 14. In some embodiments, the annealing process 26, when performed in conjunction with the capping layer 24, the thermally stable material 22, and atmospheric As, can be performed at temperatures of about 800° C. or higher.

The capping layer 24 and the thermally stable material 22 can prevent or limit the evaporation and movement of Group V atoms out of the III-V semiconductor 14 during high temperature annealing. In addition, the capping layer 24 and the thermally stable material 22 can include the III-V semiconductor 14 material and help increase the Group V element's partial pressure within the III-V semiconductor 14. During high temperature annealing, the mismatch in thermal expansion between the Group III and Group V elements within the III-V semiconductor 14 can increase strain and stress within the III-V semiconductor 14. Containing the III-V semiconductor 14 within the capping layer 24 and the thermally stable material 22 can prevent the relief of this strain and stress through faceting or by expansion upward, as in conventional techniques. As a result, the potential energy of the stress and strain can rearrange and cure the crystalline structure within the III-V semiconductor 14, and reduce the number as well as the magnitude of defects 16.

Figure 6:
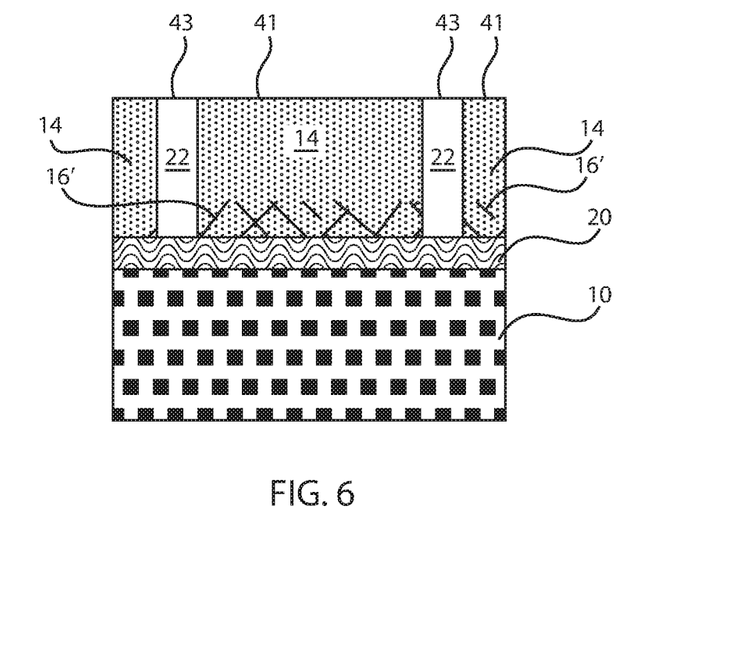
FIG. 6 is a cross-sectional view of FIG. 5 where the capping layer is removed, in accordance with an embodiment of the present invention.

FIG. 6 is a cross-sectional view of FIG. 5 where the capping layer is removed, in accordance with an embodiment of the present invention.

In various embodiments, the capping layer 24 is removed to expose a top surface 41 of the remaining III-V semiconductor 14 and a top surface 43 of the thermally stable material 22. It is contemplated that only a portion of the capping layer 24 is removed.

Figure 7:
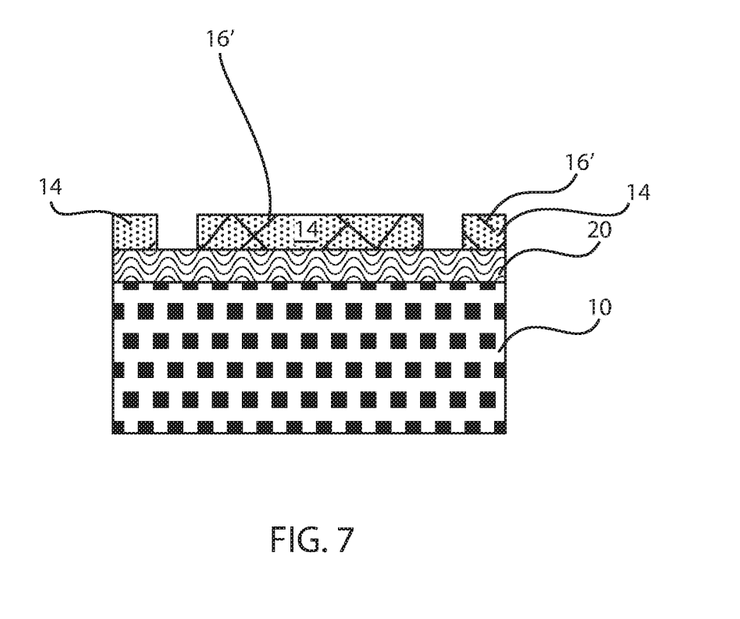
FIG. 7 is a cross-sectional view of FIG. 6 where the thermally stable non-crystalline layer is removed and a portion of the epitaxially grown III-V semiconductor is etched, in accordance with an embodiment of the present invention.

FIG. 7 is a cross-sectional view of FIG. 6 where the thermally stable non-crystalline layer is removed and a portion of the epitaxially grown III-V semiconductor is etched, in accordance with an embodiment of the present invention.

In various embodiments, the thermally stable material 22 is also removed and the epitaxially grown III-V semiconductor 14 is etched to a height of the defects 16'.

The capping layer 24 and the thermally stable material 22 can be removed through a conventional etching process, such as, for example, a wet etch or a stripping process. In some embodiments, the capping layer 24 can be fully or partially removed using a planarization process, such as, for example, chemical mechanical planarization (CMP) and the thermally stable material 22 can be removed by etching. It is also contemplated that the capping layer 24, thermally stable material 22 or both can be left in place. After annealing 26, the III-V semiconductor 14 can be further processed. For example, a gate conductor (not shown) can be formed over the upper surface of the III-V semiconductor 14 by a deposition process such as, for example, CVD, PECVD, PVD, plating, thermal or ebeam evaporation and sputtering.

Figure 8:
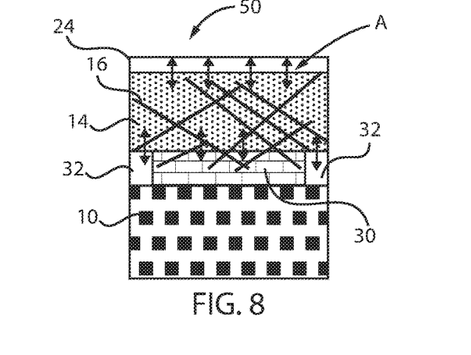
FIG. 8 is a cross-sectional view of a semiconductor structure having a crystalline material between the substrate and the epitaxially grown III-V semiconductor depicting a direction of strain, in accordance with an embodiment of the present invention.

FIG. 8 is a cross-sectional view of a semiconductor structure having a crystalline material between the substrate and the epitaxially grown III-V semiconductor depicting a direction of strain, in accordance with an embodiment of the present invention.

In various embodiments, the structure 50 depicts a first crystalline material 30 formed over a substrate 10. The first crystalline material 30 is formed between materials 32. A second crystalline material 14 is formed over the first crystalline material 30, the second crystalline material 14 including a plurality of defects 16. Arrows "A" illustrate a direction of thermally induced strain/stress. The thermally induced strain/stress is generated in one direction.

Figure 9:
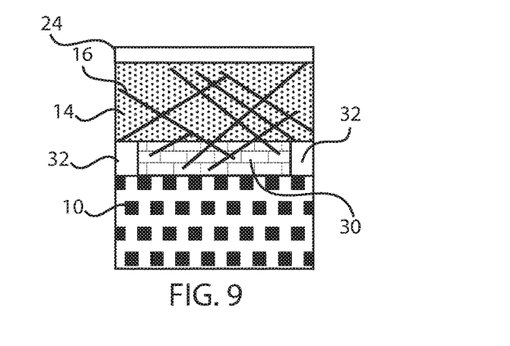
FIG. 9 is a cross-sectional view of the semiconductor structure of FIG. 8 illustrating non-movement of defects, in accordance with an embodiment of the present invention.

FIG. 9 is a cross-sectional view of the semiconductor structure of FIG. 8 illustrating non-movement of defects, in accordance with an embodiment of the present invention.

Because a first crystalline material 30 is formed adjacent a second crystalline material 30, the strain is generated in only one direction such that no edges or interfaces are created for defects to move towards. Therefore, the defects 16 remain the same or move but remain in the crystal. In other words, minimal or no reduction in the number of crystalline defects are observed by forming one crystalline material over another crystalline material and annealing. In contrast, in the exemplary embodiments of the present invention, the defects can move a short distance in any direction in three dimensions to the edge of the crystalline region and terminate and/or move out of the small crystalline regions entirely, thus significantly reducing the number of crystalline defects.

Moreover, since the crystalline material 14 is still in contact with the crystalline material 30, any misfit, strain or difference to the crystalline structure still exists during anneal and when cooled. Thus, the mechanisms that led to the creation of the defects are still present. In contrast, in the exemplary embodiments of the present invention, the intervening crystalline layer 30 is converted to a non-crystalline layer 20. The intervening layer 20 is now no longer constrained to a constant crystalline lattice and can thus more easily conform at the interface to the crystalline structure of layer 14 to allow the crystalline defects to relax by removing the forces and mechanisms causing the defects to be present.

Figure 10:
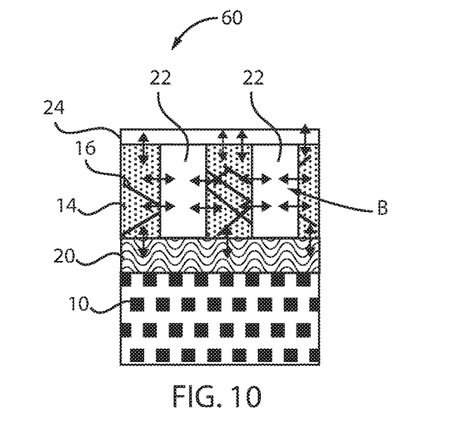
FIG. 10 is a cross-sectional view of a semiconductor structure having a non-crystalline material between the substrate and the epitaxially grown III-V semiconductor depicting a direction of strain, in accordance with an embodiment of the present invention.

FIG. 10 is a cross-sectional view of a semiconductor structure having a non-crystalline material between the substrate and the epitaxially grown III-V semiconductor depicting a direction of strain, in accordance with an embodiment of the present invention.

In various embodiments, the structure 60 depicts a non-crystalline material 20 formed over a substrate 10. A crystalline material 14 is formed over the non-crystalline material 20 (after patterning and partial removal), the crystalline material 14 including a plurality of defects 16. A thermally stable material 22 is then formed between the crystalline material 14. Arrows "B" illustrate a direction of thermally induced strain/stress. The thermally induced strain/stress is generated in two directions.

Figure 11:
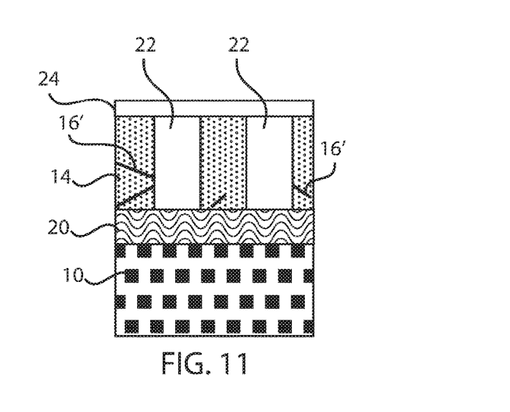
FIG. 11 is a cross-sectional view of the semiconductor structure of FIG. 10 illustrating movement of defects in two directions, in accordance with an embodiment of the present invention.

FIG. 11 is a cross-sectional view of the semiconductor structure of FIG. 10 illustrating movement of defects in two directions, in accordance with an embodiment of the present invention.

Because a non-crystalline material 20 is formed adjacent the crystalline material 14, the strain is generated in two directions such that edges or interfaces are created for defects to move towards. Therefore, the defects 16 are reduced to defects 16'. The defects 16' move toward away from the center toward sides and edges of the crystal where they can terminate. Thus, post-growth patterning allows for formation of small features. The smaller features allow for defects to move away from the regions that are desired to be defect free to the edges and interfaces of the crystalline material 14.

Figure 12:
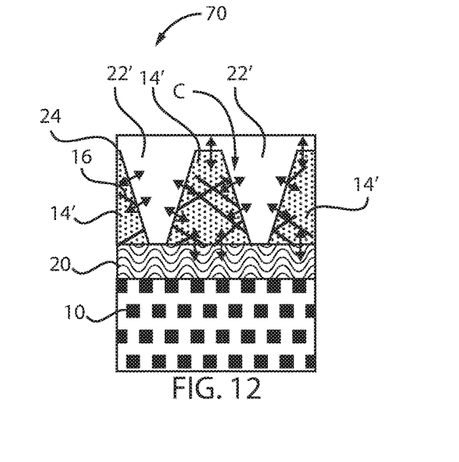
FIG. 12 is a cross-sectional view of a semiconductor structure having a non-crystalline material between the substrate and an epitaxially grown III-V semiconductor grown in a different geometrical configuration depicting a direction of strain, in accordance with an embodiment of the present invention.

FIG. 12 is a cross-sectional view of a semiconductor structure having a non-crystalline material between the substrate and an epitaxially grown III-V semiconductor grown in a different geometrical configuration depicting a direction of strain, in accordance with an embodiment of the present invention.

In various embodiments, the structure 70 depicts a non-crystalline material 20 formed over a substrate 10. A crystalline material 14' is formed over the non-crystalline material 20 (after patterning and partial removal), the crystalline material 14' including a plurality of defects 16. A thermally stable material 22' is then formed over the crystalline material 14'. Arrows "C" illustrate a direction of thermally induced strain/stress. The thermally induced strain/stress is generated in multiple directions due to the geometric configuration of the crystalline material 14'.

Figure 13:
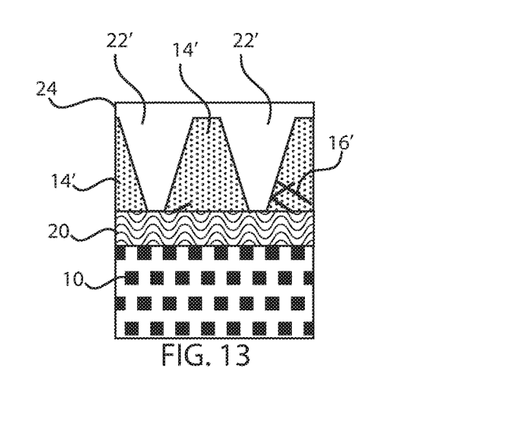
FIG. 13 is a cross-sectional view of the semiconductor structure of FIG. 12 illustrating movement of defects in multiple directions, in accordance with an embodiment of the present invention.

FIG. 13 is a cross-sectional view of the semiconductor structure of FIG. 12 illustrating movement of defects in multiple directions, in accordance with an embodiment of the present invention.

Because a non-crystalline material 20 is formed adjacent the crystalline material 14', the strain is generated in multiple directions such that edges or interfaces are created for defects to move towards. Therefore, the defects 16 are reduced to defects 16'. Post-growth patterning allows for formation of small features. The smaller features allow for defects to move away from the regions that are desired to be defect free to the edges and interfaces of the crystalline material 14.

The small feature shape and morphology may allow for strain engineering to direct the movement of the defects toward desired locations.

Therefore, FIGS. 8-13 provide a way to separate the overlying epitaxial layers from the underlying substrate after epitaxial growth. This is accomplished by forming a non-crystalline material between the substrate and the crystalline material by, e.g., oxidation to effectively separate the non-crystalline material from the substrate while maintaining an epitaxial relationship and crystalline orientation between the non-crystalline material and the substrate. This further results in more freedom at the interfaces and more movement and reduction of defects during subsequent annealing.

Figure 14:
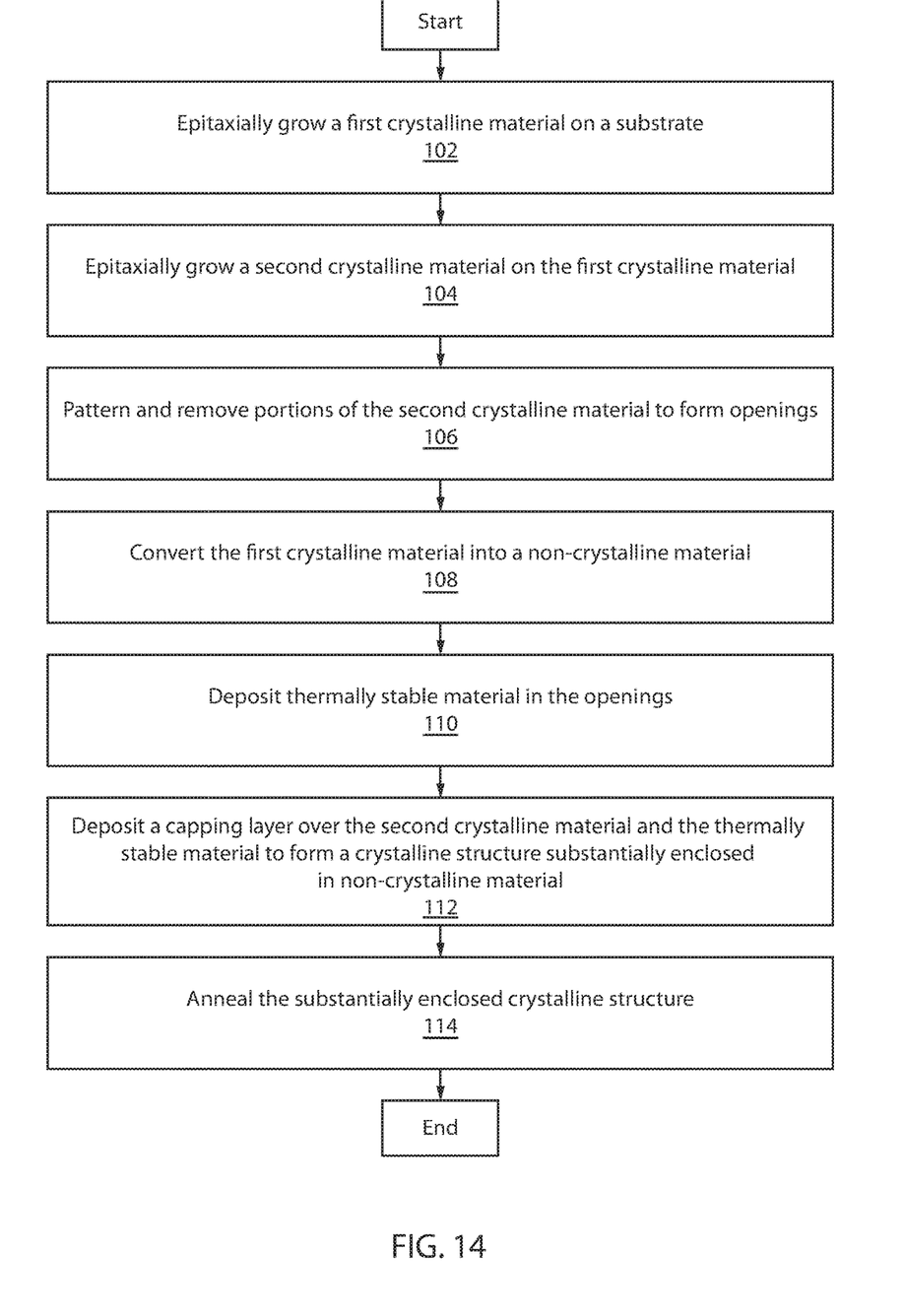
FIG. 14 is a block/flow diagram of an exemplary method for reducing defects in a semiconductor substrate, in accordance with an embodiment of the present invention.

FIG. 14 is a block/flow diagram of an exemplary method for reducing defects in a semiconductor substrate, in accordance with an embodiment of the present invention.

At block 102, a first crystalline material is epitaxially grown on a substrate. The substrate can be, e.g., a single crystal Si substrate.

At block 104, a second crystalline material is epitaxially grown on the first crystalline material. The second crystalline material can be of medium quality. Better quality materials with fewer crystalline defects do not grow directly due to lattice mismatch and differences in crystal structure.

At block 106, portions of the second crystalline material are patterned and removed to form openings. The removal can be accomplished by a number of different etching methodologies.

At block 108, the first crystalline material is converted into a non-crystalline material. The conversion can be accomplished by, e.g., oxidation.

At block 110, thermally stable material is deposited in the openings. The thermally stable material can be, e.g., SiOx.

At block 112, a capping layer is deposited over the second crystalline material and the thermally stable material to form a substantially enclosed semiconductor structure. The capping layer prevents thermal decomposition and prevents surface faceting.

At block 114, the substantially enclosed semiconductor structure is annealed. Annealing these small areas with the capping layer and separation layer in a controlled atmosphere allows for the defects to move around, and results in the reduction of such defects at surfaces of such materials. The thermally induced strain/stress are among the forces that cause the movement of the defects. Additionally, smaller areas have free sides for defects to migrate toward and terminate on.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which includes multiple copies of the chip design in question that are to be formed over a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated for reducing defects within III-V semiconductor materials epitaxially grown on mismatched crystalline substrates (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for reducing defects in a semiconductor structure, the method comprising:
    epitaxially growing a first crystalline material over a crystalline substrate, the first crystalline material being substantially planar;
    epitaxially growing a second crystalline material over the first crystalline material;
    patterning and removing portions of the second crystalline material to form openings extending to a top surface of the first crystalline material without penetrating the first crystalline material;
    converting the first crystalline material into a non-crystalline material;
    depositing a thermally stable material in the openings, the thermally stable material directly contacting the top surface of the converted substantially planar first crystalline material;
    depositing a capping layer over the second crystalline material and the thermally stable material to form a substantially enclosed semiconductor structure; and
    annealing the substantially enclosed semiconductor structure.

2. The method of claim 1, wherein the first crystalline material is converted to a non-crystalline material by oxidation.

3. The method of claim 2, wherein the non-crystalline material separates the substrate from the second crystalline material.

4. The method of claim 1, wherein the first crystalline material is a III-V semiconductor.

5. The method of claim 1, wherein the first crystalline material is a high aluminum (Al) content group III-V semiconductor material.

6. The method of claim 1, wherein the first crystalline material is a material that is converted to porous silicon (Si).

7. The method of claim 1, wherein a crystal orientation of the substrate is epitaxially related to a crystal orientation of the second crystalline material.

8. The method of claim 1, wherein annealing is performed in a controlled atmosphere of gaseous Group V material corresponding to the Group V material that is present in the III-V semiconductor.

9. The method of claim 1, wherein the thermally stable material and the capping layer include the same material.

10. The method of claim 1, wherein the capping layer and the thermally stable material include different materials.

* * * * *